(12) United States Patent
Tu et al.

(10) Patent No.: US 10,424,756 B2
(45) Date of Patent: Sep. 24, 2019

(54) FLEXIBLE DISPLAY APPARATUS AND ITS WHITE LIGHT ORGANIC ELECTROLUMINESCENT DEVICE

(71) Applicant: Shenzhen China Star Optoelectronics Technology Co., Ltd., Shenzhen, Guangdong (CN)

(72) Inventors: Aiguo Tu, Guangdong (CN); Jinchuan Li, Guangdong (CN); Liang Jiang, Guangdong (CN); Wei Yuan, Guangdong (CN); Yang Liu, Guangdong (CN); Shibo Jiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 89 days.

(21) Appl. No.: 15/553,544

(22) PCT Filed: Jul. 17, 2017

(86) PCT No.: PCT/CN2017/093069
§ 371 (c)(1),
(2) Date: Aug. 24, 2017

(87) PCT Pub. No.: WO2018/232801
PCT Pub. Date: Dec. 27, 2018

(65) Prior Publication Data
US 2018/0375051 A1    Dec. 27, 2018

(51) Int. Cl.
*H01L 51/00* (2006.01)
*H01L 51/50* (2006.01)
(Continued)

(52) U.S. Cl.
CPC ...... *H01L 51/5044* (2013.01); *H01L 27/3209* (2013.01); *H01L 51/0034* (2013.01);
(Continued)

(58) Field of Classification Search
None
See application file for complete search history.

(56) References Cited

U.S. PATENT DOCUMENTS

2014/0167016 A1    6/2014   Yoo et al.
2015/0034923 A1    2/2015   Kim et al.
(Continued)

FOREIGN PATENT DOCUMENTS

| CN | 101140979 A | 3/2008 |
| CN | 102738413 A | 10/2012 |
| CN | 105489783 A | 4/2016 |

*Primary Examiner* — Cheung Lee
(74) *Attorney, Agent, or Firm* — Andrew C. Cheng

(57) ABSTRACT

The present application provides a flexible display apparatus and a white light organic electroluminescent device including an anode, a first blue light emitting unit, a second yellow light emitting unit, a third blue light emitting unit, and a cathode successively laminated and disposed, wherein the second yellow light emitting unit including a red light emitting layer. The flexible display apparatus and a white light organic electroluminescent device provided by the application enhances the luminous intensity of the red light band in the three-laminated layer white light organic electroluminescent device by adding a red light emitting layer, and optimizes the spectrum of the white OLED device, when used as a display device it can reduce power consumption of the display apparatus.

16 Claims, 2 Drawing Sheets

(51) Int. Cl.
*H01L 51/52* (2006.01)
*H01L 27/32* (2006.01)

(52) U.S. Cl.
CPC ........ *H01L 51/5278* (2013.01); *H01L 51/006* (2013.01); *H01L 51/0058* (2013.01); *H01L 51/0061* (2013.01); *H01L 51/0067* (2013.01); *H01L 51/0072* (2013.01); *H01L 51/0085* (2013.01); *H01L 51/5056* (2013.01); *H01L 51/5072* (2013.01); *H01L 51/5088* (2013.01); *H01L 2251/303* (2013.01); *H01L 2251/5338* (2013.01); *H01L 2251/558* (2013.01)

(56) References Cited

U.S. PATENT DOCUMENTS

| | | |
|---|---|---|
| 2015/0060825 A1 | 3/2015 | Song et al. |
| 2016/0181563 A1 | 6/2016 | Cho et al. |
| 2016/0307977 A1 | 10/2016 | Liu et al. |
| 2017/0092871 A1 | 4/2017 | Kim et al. |
| 2017/0288161 A1* | 10/2017 | Kim .................. H01L 51/5044 |

* cited by examiner

| Layer | Number |
|---|---|
| cathode Al (100nm) | 118 |
| third electron injection layer LiF(1nm) | 117 |
| third electron transport layer BmPyPb(20nm) | 116 |
| third blue light emitting layer MADN: 3%DSA-ph(25nm) | 115 |
| third hole transport layer β-NPB(95nm) | 114 |
| third P-type charge generation layer HATCN(10nm) | 113 |
| second N-type charge generation layer BmPyPb: 4%Li(20nm) | 112 |
| second electron transport layer BmPyPb(20nm) | 111 |
| second yellow light emitting layer DCZPPY: Ir(BT)2(acac) (30nm) | 110 |
| red light emitting layer TCTA: 3%Ir(piq)3(5nm) | 109 |
| second hole transport layer β-NPB(30nm) | 108 |
| second p-type charge generation layer HATCN(10nm) | 107 |
| first N-type charge generation BmPyPb:4%Li(10nm) | 106 |
| first hole transport layer BmPyPb(10nm) | 105 |
| first blue light emitting layer MADN: 3%DSA-ph(25nm) | 104 |
| first hole transport layer β-NPB(160nm) | 103 |
| first hole injection layer MoO3(1nm) | 102 |
| anode ITO(70nm) | 101 |

FIG. 1

FLEXIBLE DISPLAY APPARATUS AND ITS WHITE LIGHT ORGANIC ELECTROLUMINESCENT DEVICE

FIELD OF THE INVENTION

The present application relates to an optical technology field, and more particularly to a flexible display apparatus and its white light organic electroluminescent device.

BACKGROUND OF THE INVENTION

Since the organic electroluminescent diode, OLED has the excellent features of self-luminous, no need of backlight, high contrast, thin thickness, wide viewing angle, fast response, can be used for flexible panel, can be used in a wide temperature range, construction and process is relatively simple at the same time, is considered as the new application technology in the next generation of flat display apparatus.

The OLED device structure is constructed by an anode (ITO), a cathode, and an organic functional layer sandwiched between them. The organic functional layers include HIL (hole injection layer), HTL (hole transport layer), EML (light emitting layer), ETL (electron transport layer) and other layers.

The red light component is not sufficient in the existing three-laminated layers of the white light device OLED device, the power consumption of the display apparatus is larger because of the low efficiency of red light by using the white light OLED plus color filter as a display apparatus or a TV.

SUMMARY OF THE INVENTION

The present application provides a flexible display apparatus and its white light organic electroluminescent device to solve the larger power consumption of the display apparatus caused by the low efficiency of red light by using the white light OLED plus color filter as a display apparatus or a TV in the conventional technology. In order to solve the above-mentioned technical problems, a technical aspect of the present application is to provide a white light organic electroluminescent device, the white light organic electroluminescent device includes: an anode, a first blue light emitting unit, a second yellow light emitting unit, a third blue light emitting unit, and a cathode successively laminated and disposed, wherein the second yellow light emitting unit including a red light emitting layer, and the material used for the red light emitting layer is TCTA: 3% Ir(piq)3, the thickness of the red light emitting layer is less than or equal to 5 nm.

In order to solve the above-mentioned technical problems, another technical aspect of the present application is to provide a white light organic electroluminescent device, wherein the white light organic electroluminescent device includes: an anode, a first blue light emitting unit, a second yellow light emitting unit, a third blue light emitting unit, and a cathode successively laminated and disposed, wherein the second yellow light emitting unit including a red light emitting layer.

In order to solve the above-mentioned technical problems, another technical aspect of the present application is to provide a flexible display apparatus, wherein the flexible display apparatus is using a white light organic electroluminescent device as a light emitting source.

The advantages of the present application is, comparing to the conventional technology, the flexible display apparatus and the white light organic electroluminescent device provided by the application are characterized by adding a red light emitting layer and enhancing the light-emitting intensity of the red light band in the three-laminated white light organic electroluminescent device, optimized the spectrum of the white OLED device, reducing the display power consumption when used as a display device.

BRIEF DESCRIPTION OF THE DRAWINGS

In order to more clearly illustrate the embodiments of the present application or prior art, the following FIGS. will be described in the embodiments are briefly introduced. It is obvious that the drawings are merely some embodiments of the present application, those of ordinary skill in this field can obtain other FIGS. according to these FIGS. without paying the premise.

FIG. 1 is a simplified schematic diagram of a white light organic electroluminescent device according to an embodiment of the present application.

DETAILED DESCRIPTION OF PREFERRED EMBODIMENTS

Figure 2:
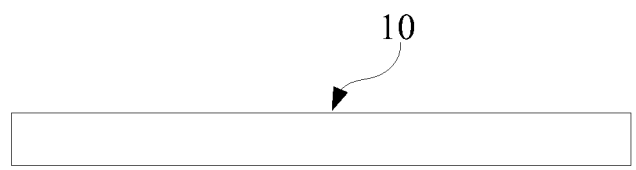
FIG. 2 is a simplified schematic view of a flexible display apparatus according to an embodiment of the present application.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

In the drawings, the thickness of the layers and regions is exaggerated in order to clarify the device. The same reference numerals denote the same elements throughout the drawings.

It will also be understood that when an element is referred to as being "over" or "upper" on another element, it can be disposed directly on the other element, or an intermediate element can also be present.

Referring to FIG. 1, a white light organic electroluminescent device is provided as an embodiment of the present application, the white light organic electroluminescent device includes an anode 101, a first blue light emitting unit 100, a second yellow light emitting unit 200, a third blue light emitting unit 300, and a cathode 118 successively laminated and disposed, wherein the second yellow light emitting unit 200 includes a red light emitting layer 109. Wherein the adapted material of the anode 101 is indium tin oxide, ITO, and having a thickness of 70 nm. The adapted material of the cathode 118 is aluminum, Al, and having a thickness of 100 nm.

In the embodiment of the present application, the material used for the red light emitting layer 109 includes TCTA: 3% Ir(piq)3, the thickness of the red light emitting layer 109 is less than or equal to 5 nm, wherein Ir(piq)3 is doped in TCTA, and the mass percentage is 3%. TCTA is 4,4',4"-Tris(carbazol-9-yl)-triphenylamine; Ir(piq)3 is Tris (1-phenyl-isoquinoline) iridium (III).

In the embodiment of the present application, the first blue light emitting unit 100 includes a first hole injection layer 102, a first hole transport layer 103, a first blue light emitting layer 104, a first electron transport layer 105, a first N-type charge generation layer 106 successively laminated and disposed.

Wherein the material of the first hole injection layer 102 is molybdenum trioxide, $MoO_3$, having a thickness of 1 nm;

The material of the first hole transport layer 103 is β-NPB (N,N'-diphenyl-N,N'-Di(2-naphthyl)-1,1'-biphenyl-4,4'-diamine), having the thickness of 160 nm;

The material of the first blue light emitting layer 104 is MADN: 3% DSA-ph and having a thickness of 25 nm, wherein MADN is 2-Methyl-9,10-bis(naphthalen-2-yl)anthracene; 9,10-Di(2-naphthyl)-2-methylanthracene; DSA-ph is 1-4-di-[4-(N, N-diphenyl)amino]styryl-benzene);

The material of the first electron transport layer 105 is BmPyPb (1,3-bis[3,5-di(pyridin-3-yl)phenyl]benzene), and having a thickness of 10 nm;

The material of the first N-type charge generation layer 106 is BmPyPb:4% Li and having a thickness of 10 nm.

In the embodiment of the present application, the second yellow light emitting unit 200 successively laminated and disposed on the first N-type charge generation layer 106 includes a second p-type charge generation layer 107, a second hole transport layer 108, a second yellow light emitting layer 110, a second electron transport layer 111, a second N-type charge generation layer 112, and the red light emitting layer 109 are located above the second hole transport layer 108.

Wherein the material of the second P-type charge generation layer 107 is HATCN (2,3,6,7,10,11-Hexacyano-1,4,5,8,9,12-hexaazatriphenylene), and having a thickness of 10 nm;

The material of the second hole transport layer 108 is β-NPB and having a thickness of 30 nm;

The material of the second yellow light emitting layer 110 is DCZPPY:Ir(BT)2(acac), and having a thickness of 30 nm, wherein the DCZPPY is 2,6-bis((9H-carbazol-9-yl)-3,1-phenylene)pyridine; Ir(BT)2(acac) is Bis(2-phenyl-benzothiazole)(acetylacetonate)

The material of the second electron transport layer 111 is BmPyPb (1,3-bis[3,5-di(pyridin-3-yl)phenyl]benzene), and having a thickness of 20 nm;

The material of the second N-type charge generation layer 112 is BmPyPb: 4% Li, and having a thickness of 20 nm.

In the embodiment of the present application, the third blue light emitting unit 300 successively laminated and disposed on the second N-type charge generation layer 112 includes a third P-type charge generation layer 113, a third hole transport layer 114, a third blue light emitting layer 115, a third electron transport layer 116, and a third electron injection layer 117.

Wherein the material of the third P-type charge generation layer 113 is HATCN (2,3,6,7,10,11-Hexacyano-1,4,5,8,9,12-hexaazatriphenylene), and having a thickness of 10 nm;

The material of the third hole transport layer 114 is β-NPB, and having a thickness of 95 nm;

The material of the third blue light emitting unit 300 is MADN: 3% DSA-ph, and having a thickness of 25 nm;

The material of the third electron transport layer 116 is BmPyPb, and having a thickness of 20 nm;

The material of the third electron injecting layer 117 is LiF (lithium fluoride), and having a thickness of 1 nm.

Combined referring to FIG. 2, the embodiment of the present application also provides a flexible display apparatus 10, the flexible display apparatus 10 is using the above-described white light organic electroluminescent device as a light emitting source.

In view of the above, it will be readily understood by those skilled in the art that the flexible display apparatus and the white light organic electroluminescent device provided by the present application can enhance the luminous intensity of the red light band in the three-laminated layer white light organic electroluminescent device by adding a red light emitting layer, and optimizes the spectrum of the white OLED device, when used as a display device it can reduce power consumption of the display apparatus.

Above are embodiments of the present application, which does not limit the scope of the present application. Any modifications, equivalent replacements or improvements within the spirit and principles of the embodiment described above should be covered by the protected scope of the invention.

What is claimed is:

1. A white light organic electroluminescent device, wherein the white light organic electroluminescent device comprises: an anode, a first blue light emitting unit, a second yellow light emitting unit, a third blue light emitting unit, and a cathode successively laminated and disposed, wherein the second yellow light emitting unit comprising a red light emitting layer; wherein the material used for the red light emitting layer is TCTA: 3% Ir(piq)3.

2. The white light organic electroluminescent device according to claim 1, wherein the thickness of the red light emitting layer is less than or equal to 5 nm.

3. The white light organic electroluminescent device according to claim 1, wherein the first blue light emitting unit comprises: a first hole injection layer, a first hole transport layer, a first blue light emitting layer, a first electron transport layer, a first N-type charge generation layer successively laminated and disposed on the anode.

4. The white light organic electroluminescent device according to claim 3, wherein the second yellow light emitting unit comprises: a second p-type charge generation layer, a second hole transport layer, a second yellow light emitting layer, a second electron transport layer, a second N-type charge generation layer successively laminated and disposed on the first N-type charge generation layer, and the red light emitting layer is located above the second hole transport layer.

5. The white light organic electroluminescent device according to claim 4, wherein the third blue light emitting unit comprises: a third P-type charge generation layer, a third hole transport layer, a third blue light emitting layer, a third electron transport layer, and a third electron injection layer successively laminated and disposed on the second N-type charge generation layer.

6. The white light organic electroluminescent device according to claim 5, wherein the material of the third P-type charge generation layer is HATCN, and having a thickness of 10 nm;

the material of the third hole transport layer is β-NPB, and having a thickness of 95 nm;

the material of the third blue light emitting unit is MADN: 3% DSA-ph, and having a thickness of 25 nm;

the material of the third electron transport layer is BmPyPb, and having a thickness of 20 nm; and the material of the third electron injecting layer is LiF, and having a thickness of 1 nm.

7. The white light organic electroluminescent device according to claim 4, wherein the material of the second P-type charge generation layer is HATCN, and having a thickness of 10 nm;
the material of the second hole transport layer is β-NPB, and having a thickness of 30 nm;
the material of the second yellow light emitting layer is DCZPPY:Ir(BT)2(acac), and having a thickness of 30 nm;
the material of the second electron transport layer is BmPyPb, and having a thickness of 20 nm; and
the material of the second N-type charge generation layer is BmPyPb: 4% Li, and having a thickness of 20 nm.

8. The white light organic electroluminescent device according to claim 3, wherein the material of the first hole injection layer is MoO3, and having a thickness of 1 nm;
the material of the first hole transport layer is β-NPB, and having the thickness of 160 nm;
the material of the first blue light emitting layer is MADN: 3% DSA-ph, and having a thickness of 25 nm;
the material of the first electron transport layer is BmPyPb, and having a thickness of 10 nm; and
the material of the first N-type charge generation layer is BmPyPb:4% Li, and having a thickness of 10 nm.

9. A flexible display apparatus, wherein the flexible display apparatus is using a white light organic electroluminescent device as a light emitting source, the white light organic electroluminescent device comprises: an anode, a first blue light emitting unit, a second yellow light emitting unit, a third blue light emitting unit, and a cathode successively laminated and disposed, wherein the second yellow light emitting unit comprising a red light emitting layer; wherein the material used for the red light emitting layer is TCTA: 3% Ir(piq)3.

10. The white light organic electroluminescent device according to claim 9, wherein the thickness of the red light emitting layer is less than or equal to 5 nm.

11. The white light organic electroluminescent device according to claim 9, wherein the first blue light emitting unit comprises: a first hole injection layer, a first hole transport layer, a first blue light emitting layer, a first electron transport layer, a first N-type charge generation layer successively laminated and disposed on the anode.

12. The white light organic electroluminescent device according to claim 11, wherein the second yellow light emitting unit comprises: a second p-type charge generation layer, a second hole transport layer, a second yellow light emitting layer, a second electron transport layer, a second N-type charge generation layer successively laminated and disposed on the first N-type charge generation layer, and the red light emitting layer is located above the second hole transport layer.

13. The white light organic electroluminescent device according to claim 12, wherein the third blue light emitting unit comprises: a third P-type charge generation layer, a third hole transport layer, a third blue light emitting layer, a third electron transport layer, and a third electron injection layer successively laminated and disposed on the second N-type charge generation layer.

14. The white light organic electroluminescent device according to claim 13, wherein the material of the third P-type charge generation layer is HATCN, and having a thickness of 10 nm;
the material of the third hole transport layer is β-NPB, and having a thickness of 95 nm;
the material of the third blue light emitting unit is MADN: 3% DSA-ph, and having a thickness of 25 nm;
the material of the third electron transport layer is BmPyPb, and having a thickness of 20 nm; and
the material of the third electron injecting layer is LiF, and having a thickness of 1 nm.

15. The white light organic electroluminescent device according to claim 12, wherein the material of the second P-type charge generation layer is HATCN, and having a thickness of 10 nm;
the material of the second hole transport layer is β-NPB, and having a thickness of 30 nm;
the material of the second yellow light emitting layer is DCZPPY:Ir(BT)2(acac), and having a thickness of 30 nm;
the material of the second electron transport layer is BmPyPb, and having a thickness of 20 nm; and
the material of the second N-type charge generation layer is BmPyPb: 4% Li, and having a thickness of 20 nm.

16. The white light organic electroluminescent device according to claim 11, wherein the material of the first hole injection layer is MoO3, and having a thickness of 1 nm;
the material of the first hole transport layer is β-NPB, and having the thickness of 160 nm;
the material of the first blue light emitting layer is MADN: 3% DSA-ph, and having a thickness of 25 nm;
the material of the first electron transport layer is BmPyPb, and having a thickness of 10 nm; and
the material of the first N-type charge generation layer is BmPyPb:4% Li, and having a thickness of 10 nm.

* * * * *